US010168110B2

(12) United States Patent
Krug, Jr. et al.

(10) Patent No.: US 10,168,110 B2
(45) Date of Patent: Jan. 1, 2019

(54) MANIFOLD FOR A LIQUID COOLING SYSTEM (71) Applicant: International Business Machines Corporation, Armonk, NY (US)

(72) Inventors: Francis R. Krug, Jr., Highland, NY (US); Randy J. Zoodsma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 14/856,592

(22) Filed: Sep. 17, 2015

(65) Prior Publication Data
US 2016/0354833 A1 Dec. 8, 2016

Related U.S. Application Data (63) Continuation of application No. 14/727,908, filed on Jun. 2, 2015.

(51) Int. Cl.
*F28F 9/10* (2006.01)
*H05K 7/20* (2006.01)
(Continued)

(52) U.S. Cl.
CPC .............. *F28F 9/10* (2013.01); *B21C 37/292* (2013.01); *B21D 19/088* (2013.01); *B21D 53/02* (2013.01);
(Continued)

(58) Field of Classification Search
CPC .......... F28F 9/10; F28F 9/0248; B21D 53/02; B21D 19/088; B23P 15/26; H05K 7/20272; B21C 37/292; B21C 37/30; B23G 7/02
See application file for complete search history.

(56) References Cited

U.S. PATENT DOCUMENTS 2,157,354 A * 5/1939 Sherman .................. B21C 1/00
29/896.6
2,898,788 A * 8/1959 Baxa ...................... B21C 37/292
470/197
(Continued)

FOREIGN PATENT DOCUMENTS

DE 3606122 A1 10/1986
EP 0779114 A2 6/1997
EP 1258608 A2 11/2002

OTHER PUBLICATIONS

Johnston et al., "Rapid Sampling From Sealed Containers", Los Alamos National Laboratory, Advanced Chemical Diagnostics and Instrumentation, http://lib-www.lanl.gov/la-pubs/00418764.pdf, LA-UR-98-4495, pp. 1-11.
(Continued)

*Primary Examiner* — Jacob J Cigna
(74) *Attorney, Agent, or Firm* — Michael O'Keefe (57) ABSTRACT A method including punching a first hole in a parent sheet metal, such that a substantially round section with a first diameter is removed from the hole, forming a second hole by inserting a mandrel into the first hole, causing a portion of the parent sheet metal to deform in a downward direction and increase the diameter of the first hole to a second diameter, the deformed portion of the parent sheet metal is substantially perpendicular to the parent sheet metal, forming a thread into an interior sidewall of the second hole, and forming the parent sheet metal into a water tight manifold.

16 Claims, 9 Drawing Sheets

Section A-A (51) Int. Cl.
- *B21C 37/29* (2006.01)
- *B23P 15/26* (2006.01)
- *B21D 19/08* (2006.01)
- *B21D 53/02* (2006.01)
- *F28F 9/02* (2006.01)

(52) U.S. Cl.
CPC ............ *B23P 15/26* (2013.01); *F28F 9/0248* (2013.01); *H05K 7/20272* (2013.01)

(56) References Cited

U.S. PATENT DOCUMENTS

| | | | |
|---|---|---|---|
| 3,358,546 A * | 12/1967 | Price | B21C 37/292 411/436 |
| 3,365,926 A * | 1/1968 | Price | B21D 22/04 29/527.1 |
| 4,213,323 A * | 7/1980 | De Deugd | B21C 37/292 72/358 |
| 5,312,080 A * | 5/1994 | Mazur | B21D 22/04 248/300 |
| 5,402,734 A | 4/1995 | Galpin et al. | |
| 5,468,028 A * | 11/1995 | Olson | F16L 33/227 285/242 |
| 6,167,953 B1 * | 1/2001 | Kobayashi | F28F 9/002 165/173 |
| 6,931,901 B2 * | 8/2005 | Ghiran | B21D 28/28 29/421.1 |
| 7,007,743 B2 * | 3/2006 | Calhoun | F28F 9/002 165/173 |
| 8,220,301 B2 * | 7/2012 | Ghiran | B21J 5/066 72/325 |
| 8,456,833 B2 | 6/2013 | Eagle | |
| 8,693,198 B2 | 4/2014 | Eckberg et al. | |
| 8,693,199 B2 | 4/2014 | Eckberg et al. | |
| 8,867,205 B2 | 10/2014 | Eagle | |
| 2003/0082257 A1 | 5/2003 | Keller et al. | |
| 2006/0175943 A1 * | 8/2006 | Paradis | A47B 47/0066 312/223.1 |
| 2008/0023185 A1 * | 1/2008 | Beamer | F28D 1/05375 165/174 |
| 2008/0168817 A1 | 7/2008 | Ghiran et al. | |
| 2011/0081438 A1 | 4/2011 | Hunter | |
| 2012/0085524 A1 | 4/2012 | Balcerak et al. | |
| 2012/0106071 A1 | 5/2012 | Eagle | |
| 2013/0188316 A1 | 7/2013 | Eagle | |
| 2013/0264030 A1 | 10/2013 | Eckberg et al. | |
| 2014/0002993 A1 | 1/2014 | Mullady | |
| 2014/0020779 A1 | 1/2014 | Vu | |
| 2014/0071626 A1 * | 3/2014 | Campbell | B23P 15/26 361/700 |

OTHER PUBLICATIONS

Morice, "Plastic pipe extrusion process improvement", Master's Thesis in Automotive Engineering, Department of Applied Mechanics, Division of Vehicle Engineering and Autonomous Systems, Chalmers University of Technology, Goteborg, Sweden, 2011, pp. 1-86.

Pending U.S. Appl. No. 14/727,908, filed Jun. 2, 2015, entitled: "Manifold for a Liquid Cooling System", 29 pages.

IBM: List of IBM Patents or Patent Applications Treated as Related (Appendix P), Sep. 30, 2015, 2 pages.

\* cited by examiner

Figure 3
Section A-A

Figure 4
Section A-A

Figure 5
Section A-A

**Figure 6
Section A-A**

Figure 7
Section A-A

**Figure 11
Section B-B**

**Figure 12
Section C**

MANIFOLD FOR A LIQUID COOLING SYSTEM

BACKGROUND

The present invention generally relates to a manifold used in a liquid cooling system, and more particularly to a method of forming a water tight connection to the manifold.

Liquid cooling systems are used to efficiently remove heat from electronic components in a computer system, for example a multi-processor computer or server. Such cooling systems may include a manifold and a heat exchanger connected by a series of hoses or pipes and pumps. The heat exchanger may be located at or near various components of the computer system and the manifold is used to distribute a cooling liquid to and from the heat exchanger via the hoses. A series of threaded ports may typically be welded to the manifold and accept a threaded fitting, for example a threaded quick connect fitting, used to connect the hoses to the manifold. The threaded ports are generally machined components which are then welded or brazed to the manifold. Machining and welding of the threaded ports adds time and cost to manufacturing of the cooling system, specifically, the manifold.

Quick connect fittings provide the ability to connect and disconnect the hoses from the liquid cooling system with virtually no liquid leakage and without adversely affecting the operation of any liquid remaining in the cooling system. Further quick connect fittings offer easy and reliable connect and disconnect operations while doing so in a minimum amount of available space without the need for extensive tool operation space or damaging the associated components of the electronic device, computer or cooling system.

SUMMARY

According to an embodiment of the present invention, a method is provided. The method may include forming a hole in a sheet metal flat pattern, the hole having a first diameter, forming a hole extrusion in the sheet metal flat pattern aligned with the hole, the hole extrusion comprises an inside diameter larger than the first diameter, forming a thread in an inner sidewall of the hole extrusion, and forming the parent sheet metal into a water tight manifold.

According to another embodiment, a method is provided. The method may include punching a first hole in a parent sheet metal, such that a substantially round section with a first diameter is removed from the hole, forming a second hole by inserting a mandrel into the first hole, causing a portion of the parent sheet metal to deform in a downward direction and increase the diameter of the first hole to a second diameter, the deformed portion of the parent sheet metal is substantially perpendicular to the parent sheet metal, forming a thread into an interior sidewall of the second hole, and forming the parent sheet metal into a water tight manifold.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Manifolds for liquid cooling systems may be designed and fabricated out of sheet metal to meet the design constraints of some custom applications. Traditionally, manifolds are formed and assembled and one or more threaded ports are subsequently welded on. This method may introduce metal shavings into a cavity of the manifold. The metal shavings may become immersed in the liquid cooling system and become mobile and may impede operation of the pump and degrade cooling of the electronic components in the computer system. Embodiments, of the proposed invention provide a method of forming a threaded hole extrusion in a sheet metal flat pattern prior to forming the flat pattern into a manifold.

The liquid cooling system must be watertight. Water leaks may result in undesirable damage to the computer system. Traditional threaded ports are costly and time consuming to ensure a water connection. Embodiments of the proposed invention may reduce the cost and time associated with fabricating the manifold while ensuring a water tight connection.

The present invention generally relates to a manifold used in a liquid cooling system, and more particularly to a method of forming a water tight connection to the manifold. One way to form a water tight connection to the manifold may include forming a threaded hole extrusion in a sheet metal flat pattern before folding and welding it together to form the manifold. One embodiment by which to form the threaded hole extrusion in the sheet metal flat pattern before folding and welding it together to form the manifold is described in detail below by referring to the accompanying drawings in FIGS. 1 to 12.

Figure 1:
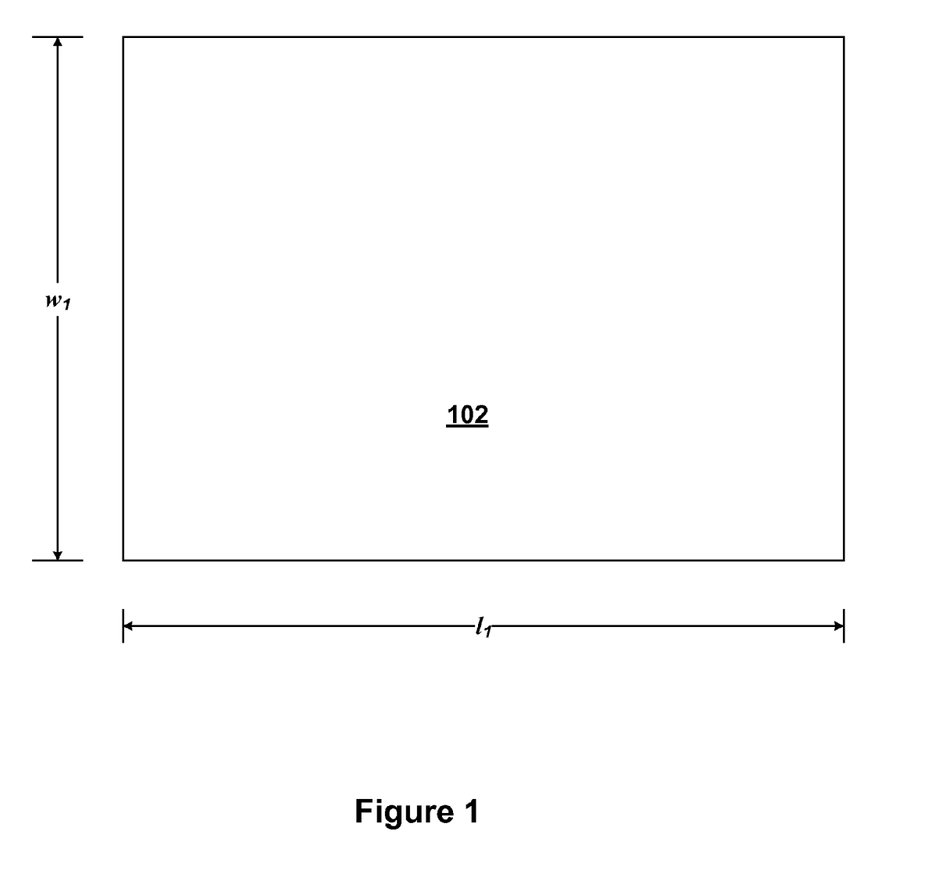
FIG. 1 illustrates a flat piece of sheet metal according to an exemplary embodiment.

Referring to FIG. 1, a piece of sheet metal 102 is shown according to an exemplary embodiment. The sheet metal 102 may have a length (l1) and a width (w1). The sheet metal 102 may be made from any of several known metals, including stainless steel, aluminum, brass, steel and copper. Some considerations when selecting a raw material may include corrosion resistance and ductility. Corrosion resistance is important due to the constant contact with the cooling liquid and ductility plays a role in fabricating a threaded hole extrusion. In a preferred embodiment, the sheet metal 102 may be a stainless steel alloy with sufficient corrosive resistance and adequate ductility to carry out fabrication techniques described below.

Figure 2:
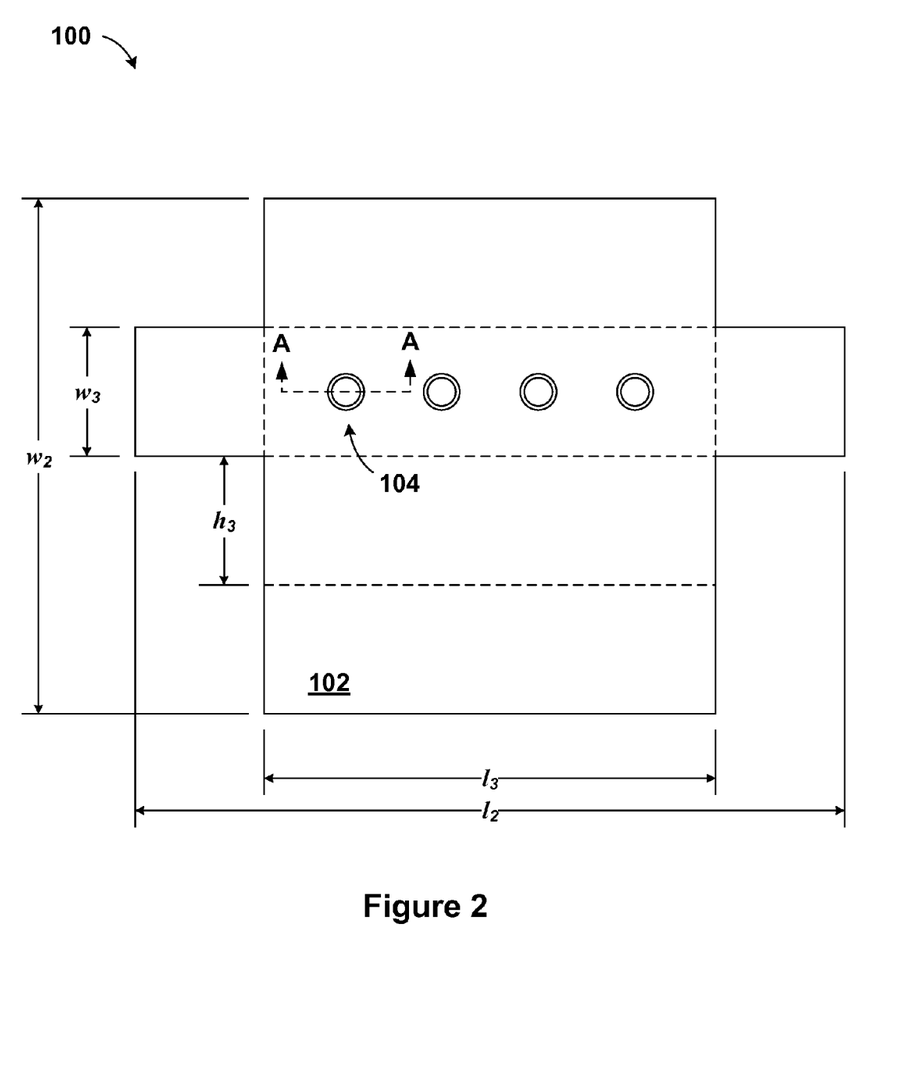
FIG. 2 illustrates the result of cutting the sheet metal into a flat pattern according to an exemplary embodiment.

Referring now to FIG. 2, the sheet metal 102 may be formed into a flat pattern 100. The flat pattern 100 may be formed by any known technique, such as, for example, powered shears, manual tin snips, laser cutting, saw cut, corner notched or punch press, among other methods. The flat pattern 100 may have a length ($l_2$) and a width ($w_2$). It should be noted that the length (l2) and the width (w2) of the flat pattern 100 may be less than or equal to the length (l1) and the width (w1) of the sheet metal 102. The dashed lines may generally indicate fold line where the sheet metal 102 may be bent to form a manifold. The flat pattern 100 may have inner dimension which are length ($l_3$) and a width ($w_3$). The length ($l_3$) and the width ($w_3$) of the flat pattern 100 may be less than or equal to the length ($l_2$) and the width ($w_2$) of the sheet metal 102 The length ($l_3$) and the width ($w_3$) of the flat pattern 100 may directly correspond to the dimensions of the finished manifold. Next, one or more threaded hole extrusions 104 may be fabricated in the flat pattern 100. Fabrication of the threaded hole extrusion 104 will be described in detail below with reference to FIGS. 3-7.

Referring now to FIGS. 3-7, fabrication steps for forming the threaded hole extrusion 104 are shown. Each of FIGS. 3-7 is a cross section view of FIG. 2, along section line A-A.

In general, a hole extrusion may be designed into a sheet metal part for any number of reasons. The inside diameter of a hole extrusion may serve as a bearing surface, a pivot point or an interface for a press-fit with another component. Most often, hole extrusions find use as screw attachments, usually cut or formed with threading taps or self-tapping screws. The threaded hole extrusion 104 of the present embodiment may be used to attached a threaded quick connect fitting used to create a watertight connection between a hose and a manifold in a liquid cooling system. The hole extrusion may include a portion of the sheet metal extending in a downward direction substantially perpendicular to a top surface of the sheet metal. The hole extrusion may also be referred to as a deformed portion of the sheet metal.

Deep-drawn hole-tapping features are often incorrectly referred to as extrusions. Deep-drawn features are produced by gathering a predetermined volume of material into a bubble, then incrementally reducing the outside diameter while simultaneously increasing the wall height through multiple redraw stations. Depending on the process design, deep-drawn features can have wall thicknesses that are less than, equal to or greater than the original sheet metal thickness. They also can achieve greater wall heights than possible with hole extrusions.

Figure 3:
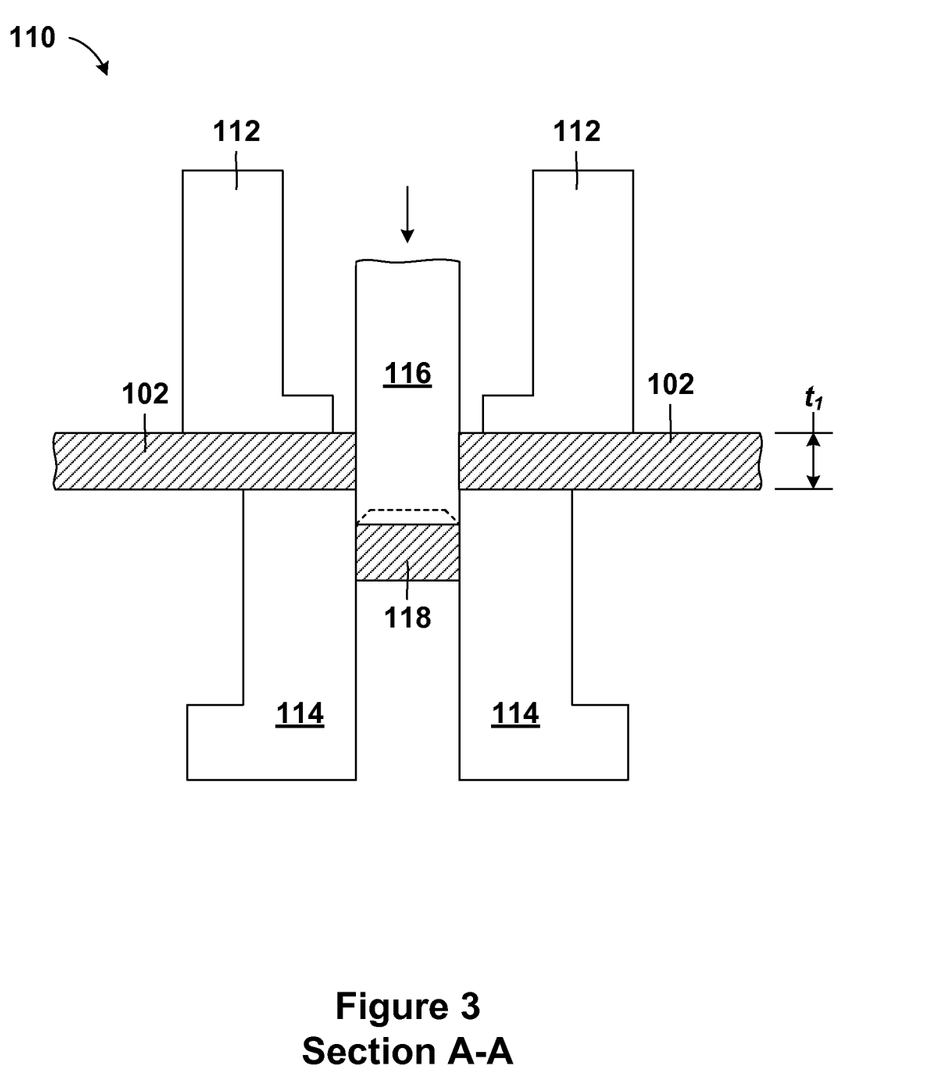
FIG. 3 is a cross-section view of FIG. 2, along section line A-A, and illustrates forming a first opening according to an exemplary embodiment.
Figure 4:
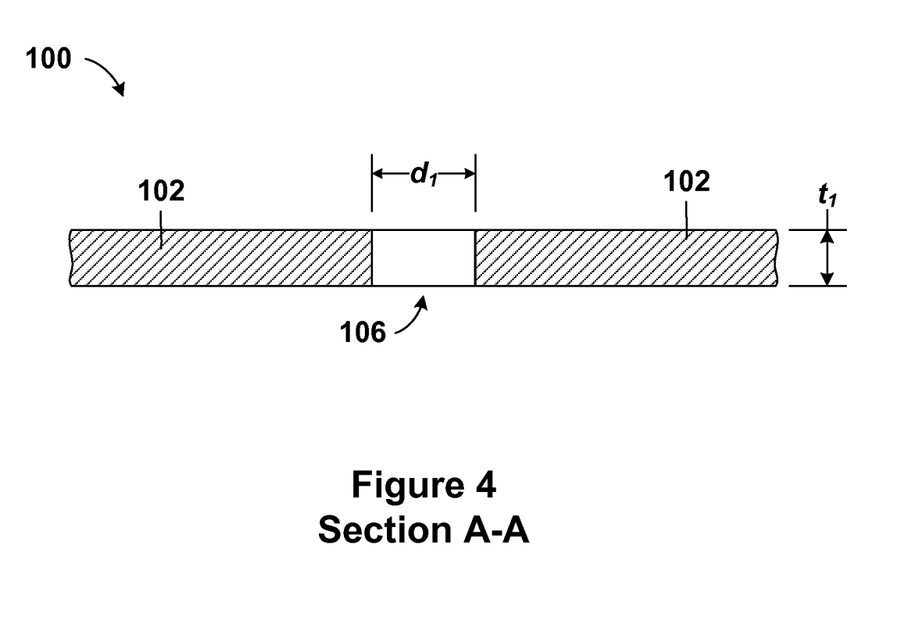
FIG. 4 is a cross-section view of FIG. 2, along section line A-A, and illustrates the first opening according to an exemplary embodiment.
Figure 5:
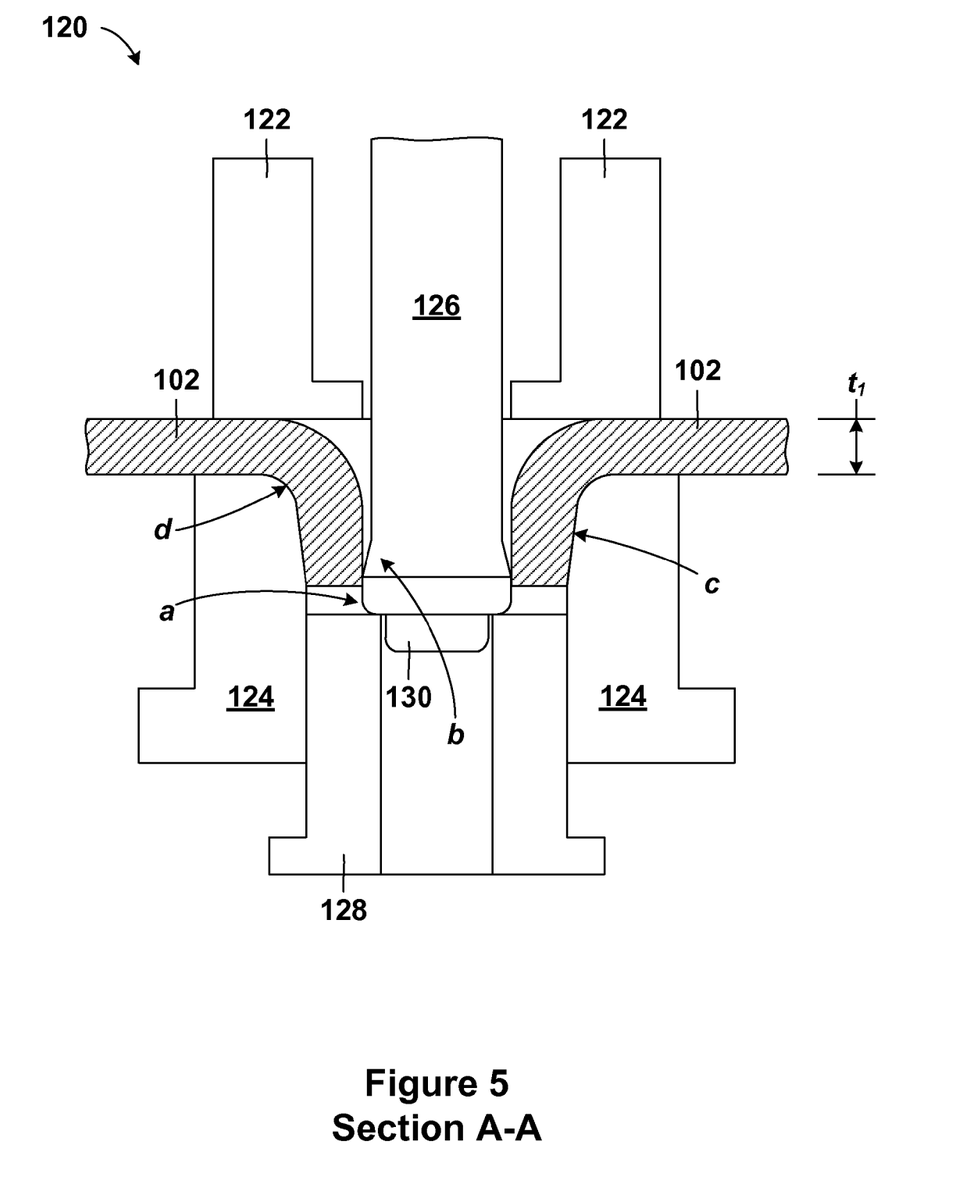
FIG. 5 is a cross-section view of FIG. 2, along section line A-A, and illustrates forming a second opening according to an exemplary embodiment.

First, a hole 106 is punched in the flat pattern 100, as shown in FIGS. 3 and 4. The hole 106 will be referred to throughout as the punched hole 106. Then an extrusion punch expands the hole to the required inside dimension (ID) forming a hole extrusion 108, as illustrated in FIG. 5. The extrusion height directly relates to a diameter ($d_1$) of the punched hole 106, the edge quality of the punched hole 106, the inside diameter of the hole extrusion 108 and the amount of allowable wall thinning.

To approximate the extrusion height, apply the constancy-of-volume rule: "Material volume is neither created nor destroyed by deformation." This is analogous to forming a hamburger—squeezing the patty reduces its thickness and increases its diameter. The volume of beef doesn't change; the material is merely displaced or rearranged. The same holds true for hole extrusions—as the extruded wall thickness decreases, the extrusion height increases.

Figure 6:
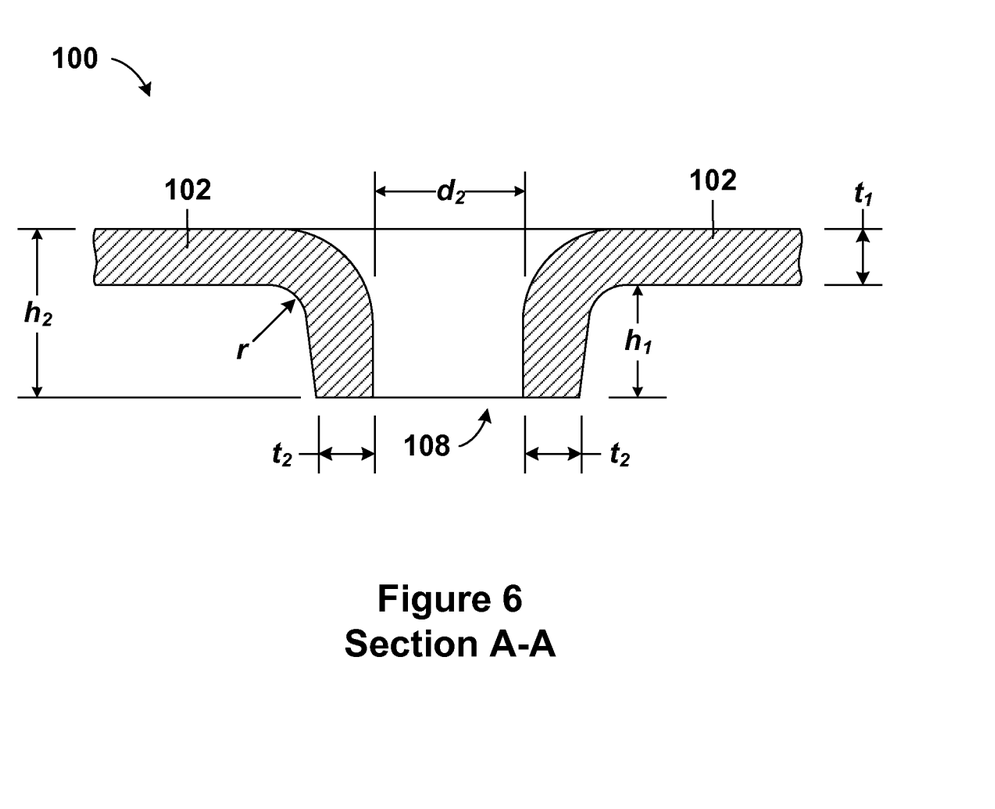
FIG. 6 is a cross-section view of FIG. 2, along section line A-A, and illustrates the second opening according to an exemplary embodiment.

Consider, for example, a hole extrusion designed as a bearing hub in a 3.0 mm thick sheet metal part. The design requires an 8.2 mm ID (e.g. ($d_2$) as shown in FIG. 6) and a minimum wall thickness of 1.5 mm, with a minimum 3.0 mm extrusion height (e.g. ($h_1$) as shown in FIG. 6). The constancy-of-volume rule can be applied as follows to determine if it is possible to successfully form a hole extrusion with the required dimensions.

Using the constancy-of-volume rule, calculate the volume of material ($V_M$) available to work with:

$$V_M = [(1/2A)^2 - (1/2B)^2]\pi t$$

where A is the inside diameter of the hole extrusion; B is the diameter of the punched hole; and t is the material thickness.

Assuming the smallest possible hole diameter that can be punched in the workpiece is equal to the material thickness:

$$V_M = [(8.2 \text{ mm}/2)^2 - (3.0 \text{ mm}/2)^2]\pi 3.0 \text{ mm}$$

$$V_M = 137.225 \text{ mm}^3$$

To determine the volume of the extrusion ($V_E$), we treat this as a cylinder with open ends and a constant wall thickness:

$$V_E = [(1/2D)^2 - (1/2A)^2]\pi h$$

where D is the outside diameter of the extrusion and is equal to the inside diameter (A) plus two-times the minimum wall thickness, or 11.2 mm. The desired extrusion wall height is 3.0 mm.

$$V_E = [(11.2 \text{ mm}/2)^2 - (8.2 \text{ mm}/2)^2]\pi 3.0 \text{ mm}$$

$$V_E = 137.131 \text{ mm}^3$$

Therefore, if VM≥VE, there is enough material volume to form the extrusion. In this case, $V_M$ slightly exceeds $V_E$, so the height of the extrusion can be made greater than 3.0 mm, if necessary. The extrusion height may be controlled by adjusting the diameter (B) of the punched hole. Thus, if the resulting extrusion height is too high, simply reduce $V_M$ by increasing the diameter of the punched hole.

In general, the volume of material available to form a hole extrusion must be greater than or equal to the volume of material contained within the hole extrusion. The amount of material available to produce a hole extrusion of a given diameter and height is proportional to the punched hole diameter, the diameter of the extrusion and the amount of permissible wall thinning. The above parameters are important considerations in order to fabricate the threaded hole extrusion 104. Most importantly, the dimensions of the hole extrusion must be sufficient to produce a high quality thread. For purposes of the present embodiment, a high quality thread is capable of accepting a threaded quick connect fitting at adequate torque to ensure a water tight connection to the manifold.

With specific reference to FIGS. 3 and 4, the punched hole 106 may be formed in the flat pattern 100 using any known metal fabrication tool, such as, for example a punch press 110. The punch press 110 may generally include a top plate 112, a bottom plate 114, and a punch 116. In the present embodiment, the bottom plate 114 may serve as a die which directly corresponds with, and paired to, the punch 116. During punching, the sheet metal 102 may be secured between the top plate 112 and the bottom plate 114 while the punch 116 is driven downward through an entire thickness ($t_1$) of the sheet metal 102 and into the die or bottom plate 114 and producing a slug 118. Afterwards, the punch 116 retracts upward and the sheet metal 102 is released from between the top plate 112 and the bottom plate 114. Alternatively, the punched hole 106 may be formed by a piercing technique or a machining technique, among other processes. Piercing techniques are less than optimal because they produce holes with fractures and poor dimensional stability. Fractures and dimensional variations will affect the quality of subsequent processing techniques, such as for example, forming the hole extrusion and threading.

The punched hole 106 may extend through the sheet metal 102 and have a vertical sidewall which is essentially perpendicular to a length ($l_1$) and a width ($w_1$) of the sheet metal 102. After punching, the punched hole 106 may be shaved and coined to debur or polish any burs or sharp edges. The punched hole 106 may be circular with a diameter ($d_1$). The diameter ($d_1$) of the punched hole 106 may depend on the material thickness, the volume of material available, and the desired hole extrusion size.

Once the correct volume of material has been established, the quality of the punched hole 106 becomes a prime concern. All hole extrusions start as hole expansions, where a punch is forced into a blanked hole, causing a circumferential elongation or stretching of the cut edge. Absolute values of expansion limits depend on the material, tool design, lubrication and edge quality of the punched hole. Circumferential elongation and quality of the hole extrusion may be improved by improving the edge quality of the punched hole 106. The edge quality of the punched hole 106 may be improved by improving the quality of the original cutting operation, using a high quality cutting operation, or using a shaved cut and deburred break edge operation.

Reducing punch-to-die cutting clearance can improve the edge quality of the punched hole 106. This results in a larger shear (cut) band, a correspondingly smaller fracture zone and small burrs forming on the backside of the hole. A larger shear band also produces a larger cold-worked zone that, combined with the small burrs, may still limit maximum edge stretchability.

Another option for improving hole quality is to use a step punch. The first point diameter cuts an initial hole while the second point diameter re-cuts the hole to provide a higher-quality cut and a more precise diameter.

Many of the problems associated with step punches result from the elastic behavior of the material being punched. When punching holes using conventional punch-to-die clearance (approx. 5 to 8 percent per side), the punching stress may force the hole-edge periphery outward in compression. When the slug breaks free, the compressive stresses relax and the punched hole relaxes inward toward the punch point.

The opposite occurs when applying engineered cutting clearances (approx. 9 to 20 percent per side). In this case, the punching stress pulls the material around the punch hole-edge periphery inward in tension. The hole relaxes outward from the punch point when the slug breaks free.

Because the hole often changes shape during the second cutting step, problems such as chipping, wear, galling or adhesion arise in as little as a few hundred or a few thousand cycles. These conditions ultimately degrade the edge quality of the hole and its ability to deform into the desired hole extrusion.

After the hole has been shaved, a small radius may be coined, for example about 0.010 in to about 0.020 in, on the bottom side to compress any burrs that may serve as stress risers. Now that the hole is properly prepared, it may then be extruded as described below with specific reference to FIGS. 5 and 6.

With specific reference to FIGS. 5 and 6, the punched hole 106 may be extruded to form the hole extrusion 108. More specifically, the hole extrusion 108 may be formed by inserting an extrusion punch into the punched hole 106 and cause a portion of the sheet metal 102 to deform in a downward direction. The hole extrusion 108 may extend in a direction perpendicular to the sheet metal 102 with a height ($h_1$), measured from a bottom surface of the sheet metal 102 to a bottom surface of the hole extrusion 108. A second height ($h_2$), measured form a top surface of the sheet metal 102 down to the bottom surface of the hole extrusion 108 is equal to the thickness ($t_1$) of the sheet metal 102 plus the height ($h_1$) of the hole extrusion 108. The hole extrusion 108 has a wall thickness ($t_2$) which, in most instances will be equal to or less than the thickness ($t_1$) of the sheet metal 102. The hole extrusion 108 may also be circular with an inside diameter ($d_2$). The height ($h_1$) of the hole extrusion 108 may depend on any or all of the diameter ($d_1$) of the punched hole 106, the inside diameter ($d_2$) of the hole extrusion 108, the thickness ($t_1$) of the sheet metal 102, the wall thickness ($t_2$) of the hole extrusion 108, in consideration with the ductility of the alloy used as the sheet metal 102.

In an embodiment, the hole may be extruded in the direction opposite of punching. This may subject the sheared edge to the most deformation and may be advantageous because the sheared edge, or leading edge, will have less damage as a result of the punching technique as compared to the fracture zone, or trailing edge.

The hole extrusion 108 may be formed in the flat pattern 100 using any known metal fabrication tool, such as, for example a punch press 120. The punch press 120 may generally include a top plate 122, a bottom plate 124, an extrusion punch 126, and a knockout pin 128. The top plate 122 may alternatively be referred to as a stripper plate and the bottom plate 124 may alternatively be referred to as a die or a bushing.

The extrusion punch 126 may preferably be fitted with a locating feature 130, also known as a pilot point. The locating feature 130 is used to locate or align the flat pattern 100, and more specifically the punched hole 106, in the punch press 120. In general, the locating feature 130 will be equal in size, or slightly smaller, and have a similar shape as the punched hole 106. If the locating feature 130 is either too big or too small the punched hole 106 may not properly located in the punch press 120 causing misalignment between the punched hole 106 and the hole extrusion 108. A leading edge or nose of the extrusion punch 126 will preferably be radiused (a) and perfectly aligned with the straight section of the bottom plate 124. Both areas must be highly polished, preferably along the working direction of the punch, as this portion of the extrusion punch 126 is subjected to extreme heat and pressure. Under these conditions, a very small scratch, unperceivable to the naked eye, will quickly lead to galling in just a few press strokes.

In an embodiment, to reduce wear during punch extraction, a back relief (b) may be provided behind the straight section of the extrusion punch 126. This allows lubrication to reach behind the punch to lubricate the tool surface when the punch extracts. It should be noted that the back relief (b) in the figure is exaggerated for purposes of clarity. As little as 0.001 in to 0.002 in per side can provide great benefits. It may be beneficial to plumb an oil line in the die to apply lubrication at this point.

An inner wall of the bottom plate 124 may preferably be tapered (c) to facilitate easy removal of the work piece, the sheet metal 102, from the punch press 120. For example, at least 1 degree of taper may be sufficient; however, the taper may be increased if the tolerance for the outside dimension of the hole extrusion 108 allows. The knockout pin 128 is provided inside the bottom plate 124 to help lift the workpiece, the sheet metal 102, from the bottom plate 124. The knockout pin 128 is used to prevent misfeeds in automated punch press processes. In addition, an upper edge of the bottom plate 124 may also be radiused (d) to facilitate easy removal of the workpiece and to prevent the formation of a stress concentration and associated cracking or fracturing.

Alternate techniques, such as, a pierce extrusion technique may be less than optimal because they produce hole extrusions with fractures and dimensional stability is very unpredictable. Fractures and dimensional variation will affect the thread quality in the final threaded hole extrusion 108.

It should be noted that the punch press 120 may include manually operated presses with tooling for a single hole extrusion per cycle or an automated production size punch press with tooling for multiple hole extrusions per cycle. In an embodiment, the punch press 120 will have tooling capable to form all the required hole extrusions of a single flat pattern in one cycle. In another embodiment, the tooling of the punch press 110 used to fabricate the punched hole 106 and the tooling of the punch press 120 used to fabricated the hole extrusion 108 may be combined in a single punch press to fabricated both the punched hole 106 and the hole extrusion 108 in one cycle.

Figure 7:
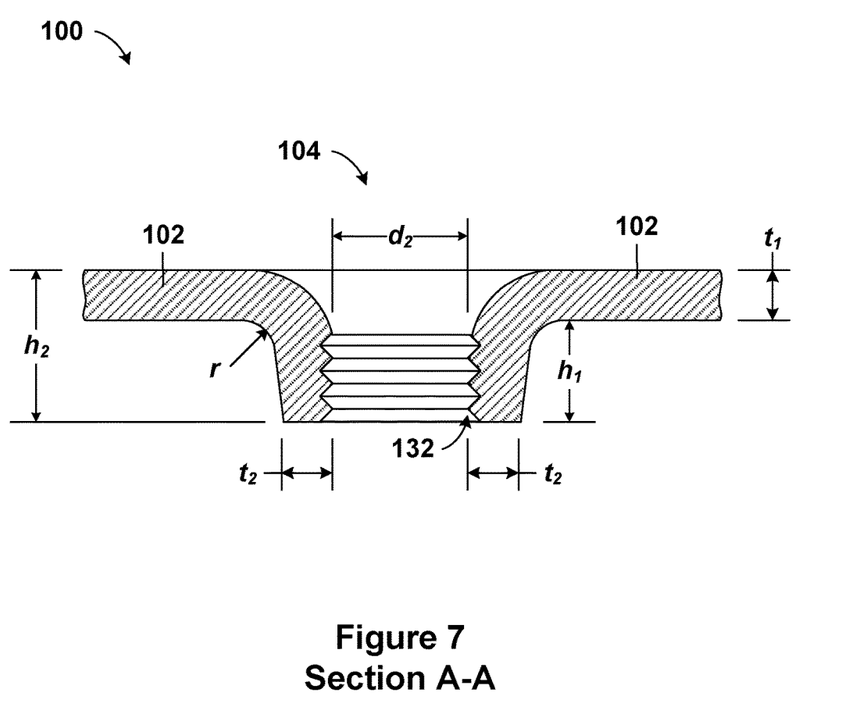
FIG. 7 is a cross-section view of FIG. 2, along section line A-A, and illustrates the formation of a thread in the second opening according to an exemplary embodiment.

With specific reference to FIG. 7, a cross-section view of the threaded hole extrusion 104 is shown after a threading operation is performed. More specifically, a female thread 132 is cut or formed from an inner sidewall of the hole extrusion 108 (FIG. 6). In a preferred embodiment, the female thread 132 is cut using a cut tap. The thread size will correspond to a threaded quick connect fitting having matching male threads. In general, the inside diameter ($d_2$) of the hole extrusion 108 should be about equal to a diameter of a tap drill of the desired thread size to ensure proper formation of the threads. Additionally, the wall thickness ($t_2$) of the hole extrusion 108 (FIG. 6) must be sufficiently thick to ensure a high quality thread having adequate strength is formed. A female thread 132 with adequate strength is one which will support tightening of the threaded quick connect fitting to a required torque to form a water tight seal. In an embodiment, the threaded quick connect fitting may be fitted with an o-ring and the required torque would be any torque sufficient to adequately compress the o-ring to ensure a water tight seal.

In an embodiment, the inside diameter ($d_2$) is determined to ensure a seventy percent thread engagement between the female thread 132 and the male thread of a threaded quick connect fitting. The extrusion height ($h_1$) may determine the number of female threads 132 in the threaded hole extrusion 104.

The first thickness ($t_1$) may range from about 1 mm to about 3 mm, and ranges between. In some embodiments, the diameter ($d_1$) of the punched hole 106 may range from about 1 mm to about 3 mm, and ranges between. In a preferred embodiment, the second diameter ($d_2$) may be 19 mm.

In an embodiment, the inside diameter ($d_2$) of the hole extrusion 108 is approximately twice the first diameter ($d_1$). In a preferred embodiment, the inside diameter ($d_2$) of the hole extrusion 108 is approximately a minimum of four times a height of the hole extrusion 108 ($h_1$). In an embodiment a height ($h_1$) of the hole extrusion 108 is at least three times a pitch of the thread. In a preferred embodiment, the second thickness ($t_2$) of the hole extrusion 108 is at least two times a difference between a major diameter of the thread and a minor diameter of the female thread 132.

Figure 8:
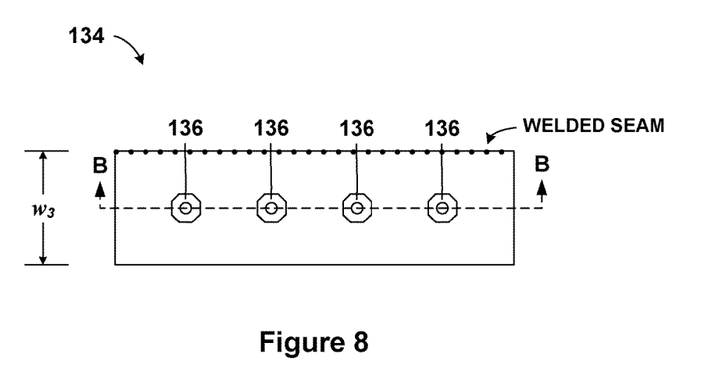
FIGS. 8, 9 and 10 illustrate folding and welding the flat pattern to form a manifold according to an exemplary embodiment.
Figure 9:
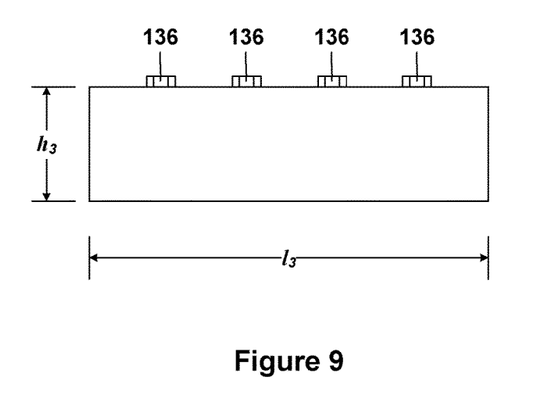
Figure 10:
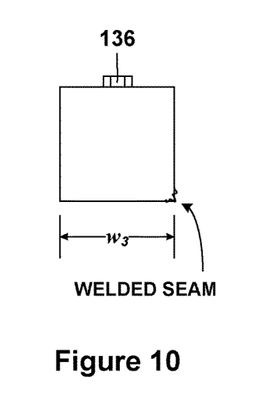

Referring now to FIGS. 8, 9 and 10, the sheet metal 102 may be folded or bent to form a manifold 134 and a threaded quick connect fitting 136 may be installing in the threaded hole extrusion 104. FIG. 9 is a front section view of FIG. 8, and FIG. 10 is a side section view of FIG. 9.

In general, the flat pattern 100 is bent along the dashed lines shown in FIG. 2 and joined along all open edges. The joining may be done by welding, soldering or brazing to form a water tight vessel or tank. It should be noted that at this stage of fabrication what will become an inner surface of the manifold 134 will have already been deburred and cleaned, leaving it substantially free of any fabrication contaminants, for example metal shavings, that may damage the cooling system when placed in service. The hole extrusion 108 may have been subject to deburring, shaving and coining, to remove any burs and sharp edges.

Figure 11:
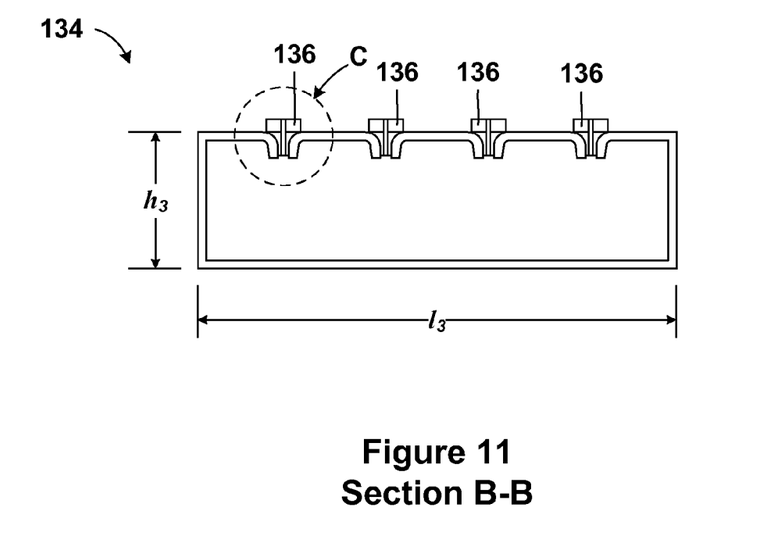
FIG. 11 is a cross-section view of FIG. 8, along section line B-B, and illustrates attaching a threaded quick connect fitting to the manifold according to an exemplary embodiment.
Figure 12:
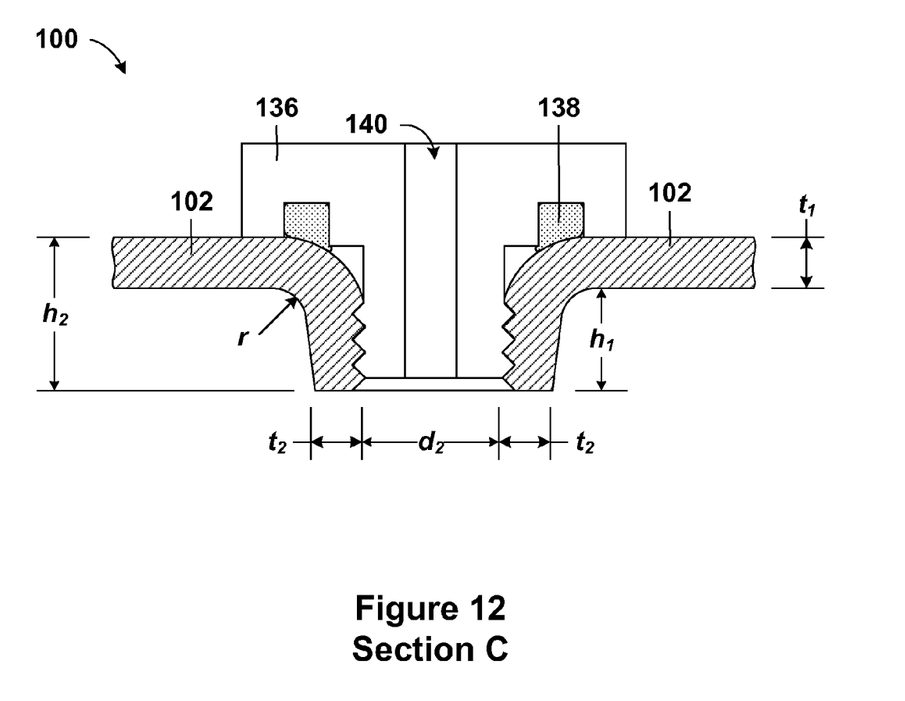
FIG. 12 is a cross-section view of FIG. 11, along section line C-C, and illustrates the quick connect attached to the manifold, according to an exemplary embodiment.

Next, the threaded quick connect fitting 136 may be installing in the threaded hole extrusion 104, as shown in FIGS. 11 and 12. FIG. 11 is a cross section view of FIG. 8 along section line B-B. FIG. 12 is an section view of FIG. 11 section C illustrating a detailed view of the threaded quick connect fitting 136 installed in the threaded hole extrusion 104. While only four threaded quick connect fittings 136 are shown as installed on one side of the manifold 134, any number of threaded quick connect fittings 136 may be installed on any side(s) of the manifold 134 based on various design requirements and constraints. Similarly, the threaded hole extrusion 104 may be fabricated anywhere and on any side of the manifold 134. As mentioned above, in an embodiment, the threaded quick connect fitting 136 will be fitted with an o-ring 138. It should be noted that the tightening torque of the threaded quick connect fitting 136 should not depend on the thread size, rather the tightening torque should be sufficient to adequately compress the o-ring 138 to ensure a water tight seal.

The threaded quick connect fitting 136 may be made from any of several known metal materials, including stainless steel, aluminum, brass, steel and copper. The threaded quick connect fitting 136 may have one or more components. In an embodiment, the threaded quick connect fitting 136 may have male threads, a hexagon top, a cavity 140 for which the cooling liquid will pass through. The o-ring 138 may be positioned in a groove in an underside of a head of the threaded quick connect fitting 136. As mentioned above, the o-ring 138 is used between the threaded quick connect fitting 136 and the manifold 134 to ensure a water tight seal.

Consider, for example, a hole extrusion designed as a bearing hub in a 3.0 mm thick sheet metal part. The design requires an 8.2 mm ID and a minimum wall thickness of 1.5 mm, with a minimum 3.0 mm extrusion height (e.g. $h_1$). The constancy-of-volume rule can be applied as follows to determine if it is possible to successfully form a hole extrusion with the required dimensions.

In an embodiment of the present invention the threaded hole extrusion 104 will be designed to accept or receive an 18 mm threaded quick connect fitting 136. An 18 mm threaded quick connect fitting 136 may have an M18×1.5 male thread with a minor diameter of about 16.3 mm, major diameter of about 17.2 mm, and a tap drill size of about 16.5 mm. If in the present embodiment, the material thickness of the sheet metal 102 is about 3 mm, the threaded hole extrusion 104 requires approximately a 16.5 mm ID and a minimum wall thickness of about 1.5 mm, with a minimum 3.0 mm extrusion wall height (e.g. $H_1$). It should be noted that the minimum wall thickness and the minimum extrusion height are dependent on the thread size and the desired thread engagement. The constancy-of-volume rule can be applied as follows to determine the constraints or limitations of forming the above threaded hole extrusion 104.

Assuming the smallest possible hole diameter that can be punched in the work piece is equal to the material thickness, the constancy-of-volume rule may be used to calculate the volume of material ($V_M$) available:

$$V_M = [(17\ mm/2)^2 - (7.0\ mm/2)^2]\pi 3.0\ mm$$

$$(t_2) = 565.2\ mm^3$$

To determine the volume of the extrusion ($V_E$), we treat this as a cylinder with open ends and a constant wall thickness:

$$V_E = [(1/2D)^2 - (1/2A)^2]\pi h$$

where D is the outside diameter of the extrusion and is equal to the inside diameter (A) plus two-times the minimum wall thickness, or 11.2 mm. The desired extrusion wall height is 3.0 mm.

$$V_E = [(23/2)^2 - (17/2)^2]\pi 3.0$$

$$V_E = 565.2\ mm^3$$

Therefore, if $V_M \geq V_E$, there is enough material volume to form the extrusion. In this case, $V_M$ slightly exceeds $V_E$, so the height of the extrusion can be made greater than 3.0 mm, if necessary. The extrusion height may be controlled by adjusting the diameter (B) of the punched hole. Thus, if the resulting extrusion height is too high, simply reduce $V_M$ by increasing the diameter of the punched hole.

In the present embodiment, a method of forming a female thread in a hole extrusion of a sheet metal, forming the sheet metal into a manifold and then joining a quick connect in the manifold provides a water tight connection which may be free of metal shavings and more economical to produce than traditional methods.

The invention described above provides a water tight manifold. The cavity of the manifold may be free of metal shavings and may be formed prior to joining with the threaded quick connect fitting 136. The resulting manifold may be water tight. The invention described above may form a threaded extrusion able to receive a quick connect to insure water tightness for a cooling system.

It may be noted that not all advantages of the present invention are include above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    punching an initial hole in a sheet metal flat pattern using a punch press, the initial hole being circular with a first diameter;
    shaving the initial hole to remove a portion of an edge of the initial hole to increase the first diameter to a second diameter;
    coining a radius on a bottom edge of the shaved hole to remove any burs and sharp edges;
    forming a hole extrusion in the sheet metal flat pattern aligned with the shaved hole in a direction opposite of the punching of the initial hole, the hole extrusion comprises an inside diameter larger than the second diameter;

cutting a thread in an inner sidewall of the hole extrusion;
forming the sheet metal flat pattern into a watertight manifold;
threading a quick connect fitting into the hole extrusion, the quick connect fitting having an o-ring positioned in a groove in an underside of a head of the quick connect fitting; and
tightening the quick connect fitting to compress the o-ring against a surface of the sheet metal immediately surrounding the hole extrusion to form a watertight seal.

2. The method of claim 1, wherein the hole extrusion comprises a portion of the sheet metal extending in a downward direction perpendicular to a top surface of the sheet metal.

3. The method of claim 1, further comprising:
deburring the hole extrusion prior to forming the sheet metal flat pattern into the watertight manifold.

4. The method of claim 1, wherein forming the watertight manifold further comprises:
joining edges of the sheet metal flat pattern via welding or brazing.

5. The method of claim 1, where a height of the hole extrusion is directly proportional to a thickness of the sheet flat pattern metal and the inside diameter of the hole extrusion.

6. The method of claim 1, wherein the inside diameter of the hole extrusion is twice the diameter of the initial hole.

7. The method of claim 1, wherein the inside diameter of the hole extrusion is a minimum of four times a height of the hole extrusion.

8. The method of claim 1, wherein a height of the hole extrusion is at least three times a pitch of the thread.

9. The method of claim 1, wherein a wall thickness of the hole extrusion is at least two times a difference between a major diameter of the thread and a minor diameter of the thread.

10. A method comprising:
punching a first hole in a parent sheet metal, such that a round section with a first diameter is removed from the hole;
coining a radius on a bottom edge of the first hole to compress any burs and sharp edges;
forming a second hole by inserting a mandrel into the first hole in a direction opposite of the punching of the first hole, causing a portion of the parent sheet metal to deform in a downward direction to form a hole extrusion and increase the diameter of the first hole to a second diameter, the deformed portion of the parent sheet metal is perpendicular to the parent sheet metal;
cutting a thread into an interior sidewall of the second hole;
forming the parent sheet metal into a watertight manifold;
threading a quick connect fitting into the hole extrusion, the quick connect fitting having an o-ring positioned in a groove in an underside of a head of the quick connect fitting; and
tightening the quick connect fitting to compress the o-ring against a surface of the sheet metal immediately surrounding the hole extrusion to form a watertight seal.

11. The method of claim 10, where a height of the deformed portion is directly proportional to a thickness of the sheet metal and the inside diameter of the hole extrusion.

12. The method of claim 10, wherein an inside diameter of the deformed portion is twice the diameter of the hole.

13. The method of claim 10, wherein an inside diameter of the deformed portion is a minimum of four times a height of the deformed portion.

14. The method of claim 10, wherein a height of the deformed portion is at least three times a pitch of the thread.

15. The method of claim 10, wherein a wall thickness of the deformed portion is at least two times a difference between a major diameter of the thread and a minor diameter of the thread.

16. A method comprising:
punching an initial hole in a sheet metal flat pattern using a punch press, the initial hole in a circular pattern with a first diameter;
shaving the initial hole to remove a portion of an edge of the initial hole to increase the first diameter to a second diameter;
coining a radius on a bottom edge of the shaved hole to compress any burs and sharp edges;
forming a hole extrusion in the sheet metal flat pattern in a direction opposite of the punching of the initial hole and aligned with the, the hole extrusion comprises an inside diameter twice that of the second diameter, the hole extrusion comprises a portion of the sheet metal extending in a downward direction perpendicular to a top surface of the sheet metal, a height of the extrusion is directly proportional to a thickness of the sheet metal and the inside diameter of the hole extrusion, and the inside diameter of the hole extrusion is a minimum of four times a height of the hole extrusion;
deburring the hole extrusion;
cutting a thread in an inner sidewall of the hole extrusion forming a threaded hole extrusion, wherein a height of the hole extrusion is at least three times a pitch of the thread, wherein a wall thickness of the hole extrusion is at least two times a difference between a major diameter of the thread and a minor diameter of the thread, wherein the thread is capable of accepting a quick connect fitting at adequate torque to ensure a watertight connection;
forming the sheet metal flat pattern into a watertight manifold, wherein joining edges of the sheet metal flat pattern comprises welding or brazing;
threading the quick connect fitting into the threaded hole extrusion; and
tightening the quick connect fitting to compress an o-ring and form a watertight connection wherein the o-ring is positioned in a groove in an underside of a head of the quick connect fitting.

* * * * *